United States Patent
Yee

(10) Patent No.: US 10,399,298 B2
(45) Date of Patent: Sep. 3, 2019

(54) PROTECTION FILM, WINDOW INCLUDING THE SAME, AND METHOD OF MANUFACTURING DISPLAY DEVICE

(71) Applicant: Samsung Display Co. Ltd., Yongin-si (KR)

(72) Inventor: Dong Su Yee, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 117 days.

(21) Appl. No.: 15/802,337

(22) Filed: Nov. 2, 2017

(65) Prior Publication Data
US 2019/0009498 A1     Jan. 10, 2019

(30) Foreign Application Priority Data

Jul. 7, 2017  (KR) ........................ 10-2017-0086536

(51) Int. Cl.
| B32B 7/06 | (2019.01) |
| H01L 51/52 | (2006.01) |
| B65D 65/40 | (2006.01) |
| B32B 37/18 | (2006.01) |
| B32B 38/10 | (2006.01) |
| H01L 27/32 | (2006.01) |
| G06F 3/041 | (2006.01) |
| H01L 51/00 | (2006.01) |

(52) U.S. Cl.
CPC ............. *B32B 7/06* (2013.01); *B32B 37/18* (2013.01); *B32B 38/10* (2013.01); *B65D 65/40* (2013.01); *H01L 27/3241* (2013.01); *H01L 51/5253* (2013.01); *B32B 2457/20* (2013.01); *G02F 2201/50* (2013.01); *G06F 3/0412* (2013.01); *H01L 51/0005* (2013.01)

(58) Field of Classification Search
CPC combination set(s) only.
See application file for complete search history.

(56) References Cited

U.S. PATENT DOCUMENTS

| 8,044,942 | B1 * | 10/2011 | Leonhard | G06F 1/1637 |
| | | | | 345/173 |
| 9,061,542 | B1 * | 6/2015 | Huang | B44F 1/063 |
| 9,063,699 | B1 * | 6/2015 | Huang | G06F 1/1643 |
| 9,283,731 | B2 * | 3/2016 | Leonhard | B32B 3/10 |
| 9,292,128 | B1 * | 3/2016 | Huang | G06F 1/1643 |
| 10,067,581 | B2 * | 9/2018 | Huang | G06F 1/1643 |
| 2009/0011806 | A1 * | 1/2009 | Man | H01Q 1/245 |
| | | | | 455/575.7 |
| 2009/0267558 | A1 | 10/2009 | Jung | |
| 2016/0062495 | A1 * | 3/2016 | Huang | G06F 1/1643 |
| | | | | 428/131 |
| 2018/0065281 | A1 * | 3/2018 | Light | B29C 39/10 |
| 2019/0050025 | A1 * | 2/2019 | Wilson | G06F 3/041 |

FOREIGN PATENT DOCUMENTS

| KR | 10-2009-0113418 | 11/2009 |
| KR | 10-1683269 | 12/2016 |

\* cited by examiner

*Primary Examiner* — Sing P Chan
(74) *Attorney, Agent, or Firm* — H.C. Park & Associates, PLC

(57) ABSTRACT

A protection film includes a film layer and a spacer. The spacer is disposed on a surface of the film layer. The spacer includes at least one separation region formed in a thickness direction from a surface of the spacer.

30 Claims, 24 Drawing Sheets

PROTECTION FILM, WINDOW INCLUDING THE SAME, AND METHOD OF MANUFACTURING DISPLAY DEVICE

CROSS-REFERENCE TO RELATED APPLICATION

This application claims priority from and the benefit of Korean Patent Application No. 10-2017-0086536, filed Jul. 7, 2017, which is hereby incorporated by reference for all purposes as if fully set forth herein.

BACKGROUND

Field

Exemplary embodiments relate to a protection film, a window including the same, and a method of manufacturing a display device.

Discussion

A display device, which is a device capable of displaying an image, may include an organic light-emitting display panel, a liquid crystal display panel, or the like. The display device may include a window for protecting a display panel from an external impact. For instance, a window is typically applied to portable electronics, such as smart phones. The window may include a window substrate and a protection film. The protection film serves to protect the window substrate in the process of manufacturing and transporting the window. When the window is attached to a display panel, the protection film is stripped and removed.

The ability to rapidly remove the protection film enables increases in processing efficiency. The protection film, however, may be warped in the process of stripping the protection film. In this case, when the protection film is not flexible, it is not easy to strip the protection film. Further, to avoid warping the protection film, a space for stripping the protection film is typically required, but this not only increases manufacturing cost, but also makes rapid stripping more difficult.

The above information disclosed in this section is only for understanding the background of the inventive concepts, and, therefore, may contain information that does not form prior art.

SUMMARY

Some exemplary embodiments are capable of providing a protection film having flexibility at the time of stripping.

Some exemplary embodiments are capable of providing a window that can easily strip a protection film.

Some exemplary embodiments are capable of providing a method of manufacturing a display device that can easily strip a protection film for a window.

Additional aspects will be set forth in the detailed description which follows, and, in part, will be apparent from the disclosure, or may be learned by practice of the inventive concepts.

According to some exemplary embodiments, a protection film includes a film layer and a spacer. The spacer is disposed on a surface of the film layer. The spacer includes at least one separation region formed in a thickness direction from a surface of the spacer.

According to some exemplary embodiments, a window includes a window substrate and a first protection film disposed on a surface of the window substrate. The first protection film includes a first film layer and a spacer disposed on a surface of the first film layer. The spacer includes at least one separation region formed in a thickness direction from a surface of the spacer.

According to some exemplary embodiments, a method of manufacturing a display device includes preparing a window, the window including: a window substrate, and a protection film disposed on a surface of the window substrate. The method further includes: stripping the protection film from the window substrate. The protection film includes a film layer and a spacer disposed on a surface of the film layer. The spacer includes at least one separation region formed in a thickness direction from a surface of the spacer.

According to some exemplary embodiments, a protection film includes a film layer and a spacer. The spacer is disposed on a surface of the film layer. The spacer includes at least one hole. The at least one hole is a line type pattern.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

Figure 1:
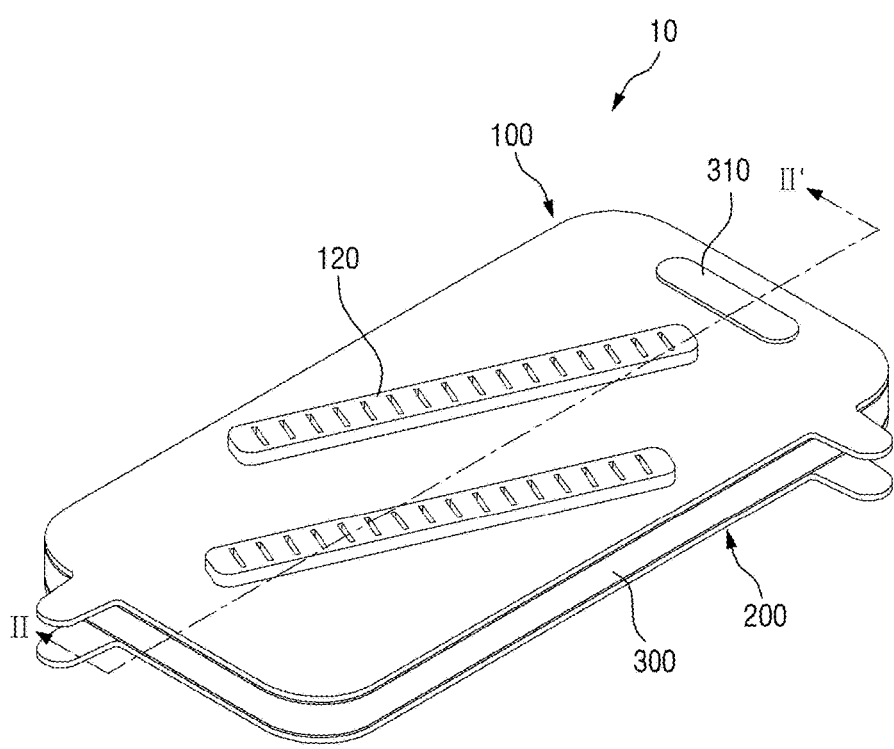
FIG. 1 is a perspective view of a window according to some exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be implemented in another exemplary embodiment without departing from the spirit and the scope of the disclosure.

Unless otherwise specified, the illustrated exemplary embodiments are to be understood as providing exemplary features of varying detail of some exemplary embodiments. Therefore, unless otherwise specified, the features, components, modules, layers, films, panels, regions, aspects, etc. (hereinafter individually or collectively referred to as "elements"), of the various illustrations may be otherwise combined, separated, interchanged, and/or rearranged without departing from the spirit and the scope of the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. To this end, the term "connected" may refer to physical, electrical, and/or fluid connection. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. In this manner, regions illustrated in the drawings are schematic in nature and shapes of these regions may not illustrate the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
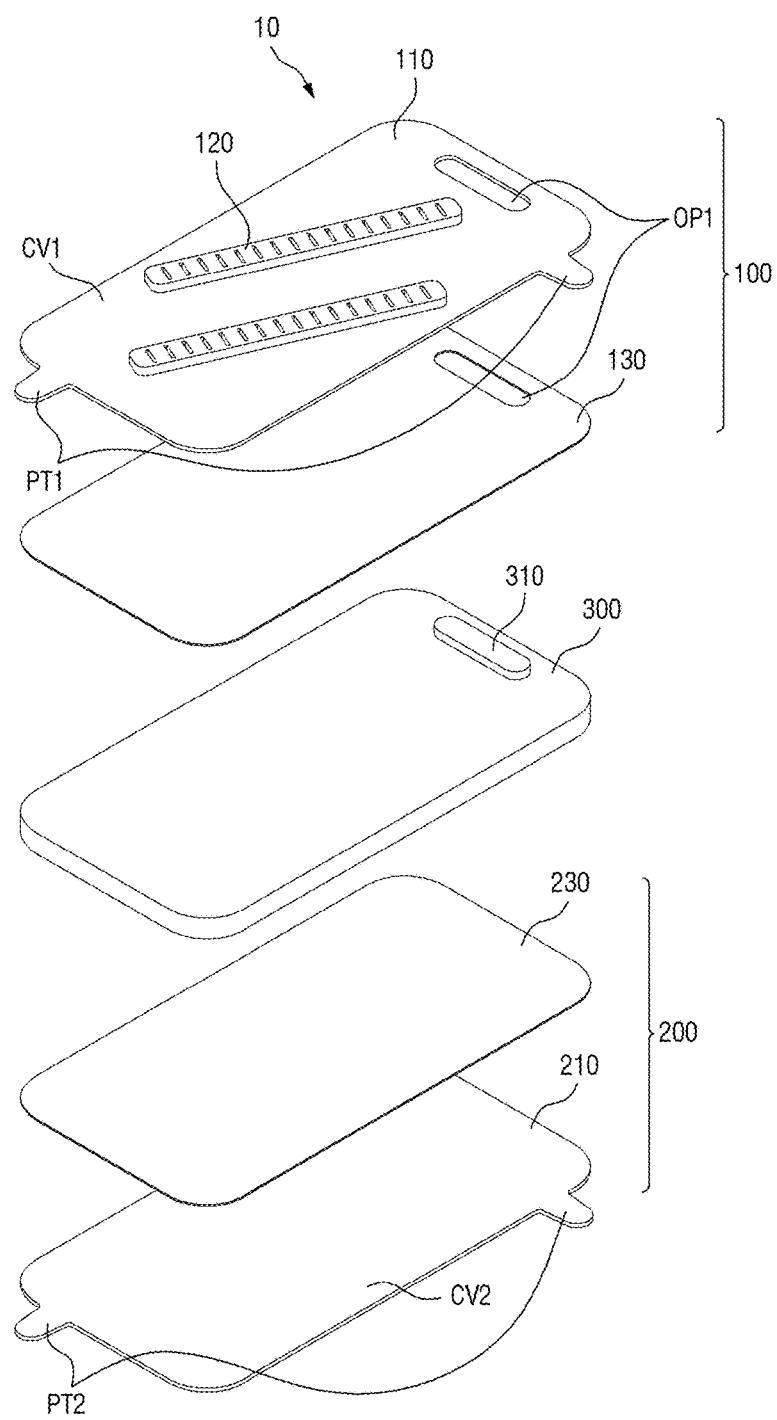
FIG. 2 is an exploded perspective view of the window of FIG. 1 according to some exemplary embodiments.
Figure 3:
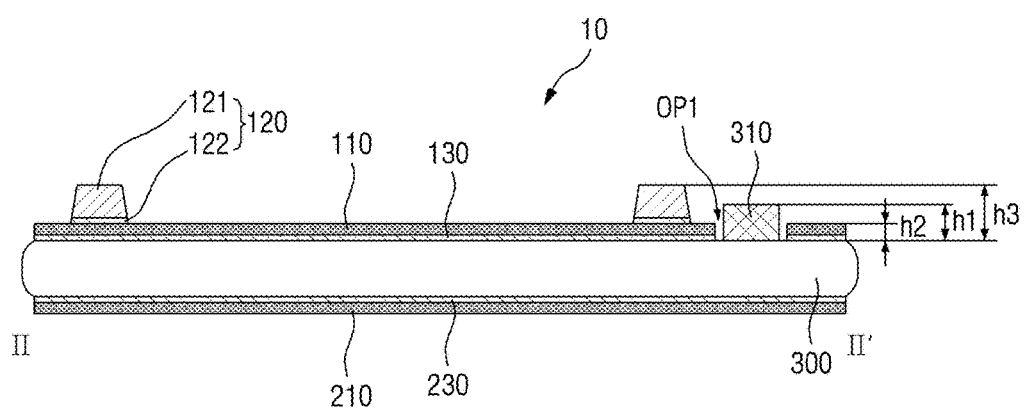
FIG. 3 is a sectional view taken along sectional line of FIG. 1 according to some exemplary embodiments.
Figure 4:
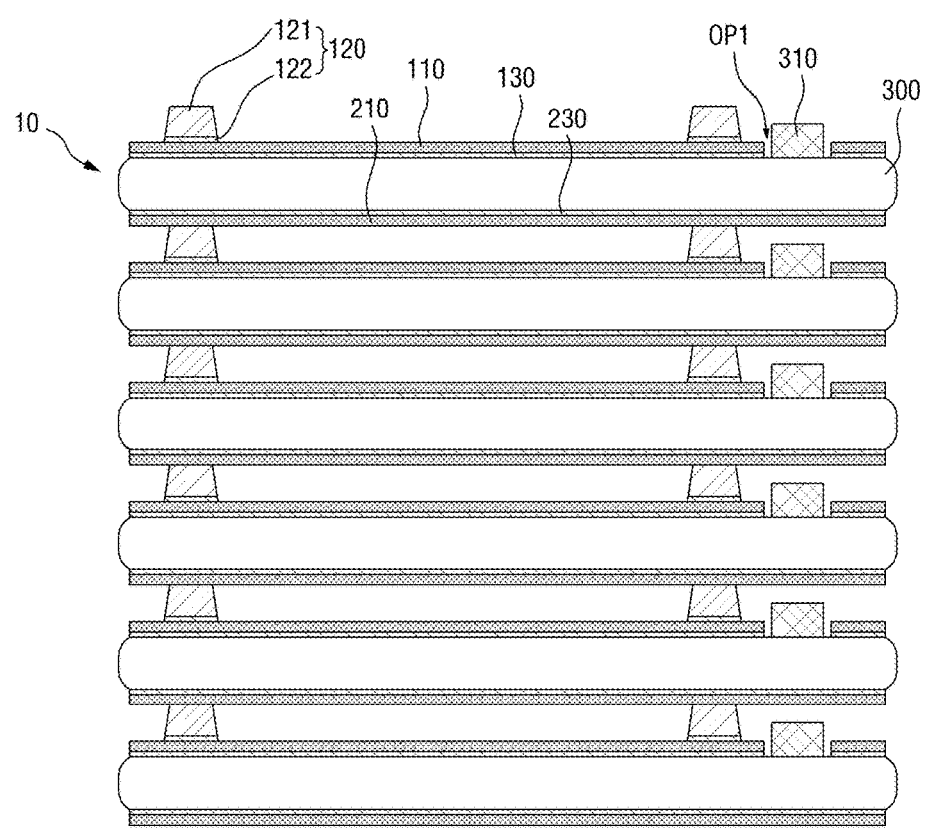
FIG. 4 is a sectional view of a case including a plurality of windows of FIG. 3 being stacked according to some exemplary embodiments.

FIG. 1 is a perspective view of a window according to some exemplary embodiments. FIG. 2 is an exploded perspective view of the window of FIG. 1 according to some exemplary embodiments. FIG. 3 is a sectional view taken along sectional line of FIG. 1 according to some exemplary embodiments. FIG. 4 is a sectional view of a case including a plurality of windows of FIG. 3 being stacked according to some exemplary embodiments.

Referring to FIGS. 1 to 4, a window 10 includes a window substrate 300, a first protection film 100, and a second protection film 200. Each of the first protection film 100 and the second protection film 200 may be a protection film for windows.

The window substrate 300 serves to cover and protect a display panel or a touch panel. In some embodiments, the first and second protection films 100 and 200 are attached to the upper and lower surfaces of the window substrate 300, respectively. However, when the window substrate 300 is applied to a display device, the first and second protection films 100 and 200 are stripped and removed. In this manner, the window substrate 300 alone may serve as a cover window.

The window substrate 300 may be made of a transparent material. For example, the window substrate 300 may contain glass or plastic. When the window substrate 300 contains plastic, the window substrate 300 may have flexible properties.

Examples of the plastic applicable to the window substrate 300 may include, but are limited to, polyimide, polyacrylate, polymethyl methacrylate (PMMA), polycarbonate (PC), polyethylene naphthalate (PEN), polyvinylidene chloride, polyvinylidene difluoride (PVDF), polystyrene, an ethylene vinylalcohol copolymer, polyethersulphone (PES), polyetherimide (PEI), polyphenylene sulfide (PPS), polyallylate, tri-acetyl cellulose (TAC), and cellulose acetate propionate (CAP). The plastic window may be made of at least one of the plastic materials listed above.

When the window substrate 300 contains a plastic, coating layers (not shown) may be disposed on the upper and lower surfaces thereof. In some embodiments, the coating layer may be a hard coating layer including an organic layer and/or organic-inorganic composite layer containing an acrylate compound and the like. The organic layer may contain an acrylate compound. The organic-inorganic composite layer may be a layer in which an inorganic material, such as silicon oxide, zirconium oxide, aluminum oxide, tantalum oxide, niobium oxide, or glass bead, is dispersed in an organic material, such as an acrylate compound. In at least one other embodiment, the coating layer may include a metal oxide layer. The metal oxide layer may contain a metal oxide, such as titanium oxide, aluminum oxide, molybdenum oxide, tantalum oxide, copper oxide, indium oxide, tin oxide, or tungsten oxide, but embodiments are not limited thereto.

The planar shape of the window substrate 300 corresponds to the shape of a display device to which the window substrate is applied. For example, when the display device is substantially rectangular on a plane, the window substrate 300 also has a substantially rectangular shape. As another example, when the display device is circular, the window substrate 300 also has a circular shape. Although a rectangular shape having rounded corners is illustrated in the drawings, the shape of the window substrate 300 is not limited thereto.

The window substrate 300 includes one surface and the other surface. One surface of the window substrate 300 is a surface facing a display panel, and the other surface of the window substrate 300 is a surface from which a screen is displayed. A display panel or a touch panel may be attached to one surface of the window substrate 300.

One surface of the window substrate 300 is provided with a first protection film 100, and the other surface of the window substrate 300 is provided with a second protection film 200 so as to protect both surfaces of the window substrate 300. The first protection film 100 and the second protection film 200 are attached to the window substrate 300 to protect both surfaces of the window substrate 300 during a process of transporting and loading the window 10. However, the first protection film 100 and the second protection film 200 is stripped and removed during a process of mounting the window substrate 300 on the display device.

The first protection film 100 includes a first film layer 110 and a first film bonding layer 130, and the second protection film 200 includes a second film layer 210 and a second film bonding layer 230.

The first film layer 110 and the second film layer 210 cover one surface and the other surface of the window substrate 300, respectively. The first film layer 110 and the second film layer 210 may include cover portions CV1 and CV2 overlapping the window substrate 300 and one or more pull tap portions PT1 and PT2 outwardly protruding from the cover portions CV1 and CV2, respectively.

Each of the first cover portion CV1 of the first film layer 110 and the second cover portion CV2 of the second film layer 210 has the same shape as or substantially similar shape as the window substrate 300 to be disposed to overlap the window substrate 300 so as to substantially cover the window substrate 300. The first cover portion CV1 and the second cover portion CV2 may have the same size as the window substrate 300 to completely cover one surface and the other surface of the window substrate 300. However, the sizes of the first cover portion CV1 and the second cover portion CV2 may be somewhat smaller than the window substrate 300 to expose a part of the edge of the window substrate 300.

The first pull tab portion PT1 of the first film layer 110 and the second pull tab portion PT2 of the second film layer 210 are connected to the first cover portion CV1 and the second cover portion CV2, respectively, and protrude outward therefrom. The first pull tab portion PT1 and the second pull tab portion PT2 may protrude outward on a plane with respect to the window substrate 300. That is, the first pull tab portion PT1 and the second pull tab portion PT2 do not at least partially overlap the window substrate 300 on a plane. Since the first pull tab portion PT1 and the second pull tab portion PT2 protrude from the window substrate 300, when stripping the first film layer 110 and the second film layer 210 from the window substrate 300, it is easy to grip the first protection film 100 and the second protection film 200 through the first pull tab portion PT1 and the second pull tab portion PT2. Therefore, the process of stripping the first and second protection films 100 and 200 can be rapidly performed.

The numbers and position of the first pull tab portions PT1 and the second pull tab portions PT2 are not limited. The numbers and positions of the first pull tab portions PT1 and the second pull tab portions PT2 may be different from each other. Although it is shown in the drawings that two first tab portions PT1 are disposed on the lower short side and right long side of the first film layer 110 and two second tab portions PT2 are disposed on the lower short side and right long side of the second film layer 110, the numbers and positions of the first pull tab portion PT1 and the second pull tab portion PT2 may be variously changed in consideration of convenience and stability of a stripping process. For example, in the case where a mounting component 310 to be described later is disposed near one short side of the window substrate 300, the first pull tab portion PT1 may be disposed on the other short side other than the short side on which the mounting component 310 is disposed so that collision with the mounting component 310 can be prevented.

Each of the first film layer 110 and the second film layer may be made of polyethylene terephthalate (PET), polyimide (PI), polycarbonate (PC), polyethylene (PE), polypropylene (PP), polysulfone (PSF), polymethyl methacrylate (PMMA), triacetylcellulose (TAC), or a cycloolefin polymer (COP).

The first film bonding layer 130 is disposed on the other surface of the first cover portion CV1 of the first film layer 110 to bond the first film layer 110 to one surface of the window substrate 300. That is, the first film layer 110 is attached to one surface of the window substrate 300 through the first film bonding layer 130. The second film bonding layer 230 is disposed on one surface of the second cover portion CV2 of the second film layer 210 to bond the second film layer 110 to the other surface of the window substrate 300. That is, the second film layer 210 is attached to the other surface of the window substrate 300 through the second film bonding layer 230. The first film bonding layer 130 and the second film bonding layer 230 may be disposed on the entire surface of the first cover portion CV1 and the entire surface of the second cover portion CV2, respectively. However, embodiments are not limited thereto, and the first film bonding layer 130 and the second film bonding layer 230 may also be partially disposed at a level at which the first film bonding layer 130 and the second film bonding layer 230 can be bonded. The first film bonding layer 130 and the second film bonding layer 230 may not be disposed on the first pull tab portion PT1 and the second pull tab portion PT2 that are not required to be bonded to the window substrate 300.

The bonding force of the first film bonding layer 130 to the window substrate 300 and the bonding force of the second film bonding layer 230 to the window substrate 300 are sufficient as long as the first film layer 110 and the second film layer 210 can be attached to the window substrate 300 without being detached from the window substrate 300 during storage or transportation.

At the time of separating the first and second protection films 100 and 200, the first film bonding layer 130 and the second film bonding layer 230 may be detached from the window substrate 300 while being attached to the first film layer 110 and the second film layer 210, and, in some embodiments, the first film bonding layer 130 and the second film bonding layer 230 do not remain on the surface of the window substrate 300. From this viewpoint, the bonding force of the first film bonding layer 130 to the window substrate 300 and the bonding force of the second film bonding layer 230 to the window substrate 300 may be smaller than the bonding force of the first film bonding layer 130 to the first film layer 110 and the bonding force of the second film bonding layer 230 to the second film layer 210, respectively.

Each of the first film bonding layer 130 and the second film bonding layer 230 may be a low adhesive layer. For example, each of the first film bonding layer 130 and the second film bonding layer 230 may be made of an acrylic material, a silicone-based material, or a urethane-based material.

The window 10 may further include a mounting component 310 disposed on one surface and/or the other surface of the window substrate 300. The mounting component 310 may be a speaker, a camera, a communication module, a chip, a sensor, or the like. The mounting component 310 may include a mesh structure made of a metal material or a mesh structure and a reinforcing material. The mounting component 310 may be attached to the surface of the window substrate 300 through an adhesive, a tape, or the like, or may be directly mounted on the window substrate 300. The window substrate 300 may include a recess in which the mounting component 310 is disposed, and the mounting component 310 may be disposed in the recess. The mounting component 310 may protrude from the surface of the window substrate 300 in the thickness direction. Although it is shown in the drawings that one mounting component 310 is disposed at the upper end (e.g., upper short side) on the one surface of the window substrate 300, a plurality of mounting components 310 may be disposed at various positions.

According to some exemplary embodiments where the mounting component 310 is disposed on one surface of the window substrate 300, the first cover portion CV1 of the first film layer 110 may be exposed without covering the mounting component 310. For this purpose, the first cover portion CV1 may include a first opening OP1. The first opening OP1 may be a closed-type opening completely surrounded by the constituent material of the first cover portion CV1 on a plane, but may be an open-type opening partially surrounded by the constituent material of the first cover portion CV1 and partially opened. Similarly to the first cover portion CV1, the first film bonding layer 130 disposed under the first cover portion CV1 may further include a first opening OP1 at the same position as the first opening OP1 in the first cover portion CV1 of the first film layer 110.

The height h1 of the surface of the mounting component 310 from one surface of the window substrate 300 may be greater than the height h2 of the surface of the first film layer 110 in the first cover portion CV1 from the one surface of the window substrate 300. That is, the mounting component 310 may protrude from the first cover portion CV1 in the thickness direction. In the case where the mounting component 310 protrudes from the first cover portion CV1 in the thickness direction, when the plurality of windows 10 (for example, tens to hundreds of windows 10) are stacked and stored or moved, the mounting component 310 and the neighboring window 10 may be in direct contact with each other. Even when the height h1 of the surface of the mounting component 310 is lower than or equal to the height h2 of the surface of the first film layer 110 in the first cover portion CV1 with respect to one surface of the window substrate 300 of a single window 10, the height h2 of the surface of the first film layer 110 may be lowered by the load of the stacked windows 10 such that the mounting component 310 and the neighboring window 10 may be in direct contact with each other. When the mounting component 310 and the neighboring window are in direct contact with each other, there is a possibility that the window substrate 300 and/or the mounting component 310 may be damaged due to pressure, friction, or the like, as well as stacking stability deteriorates.

In order to prevent the window substrate 300 and/or the mounting component 310 from being damaged during stacking, the first protection film 100 further includes at least one spacer 120. The spacer 120 is disposed on one surface of the first cover portion CV1 to increase the total thickness of the first protection film 100. Therefore, when stacking the windows 10, the distance between the window substrates 300 in the thickness direction may be increased.

In some embodiments, the height h3 of the surface of the spacer 120 may be greater than the height h1 of the surface of the mounting component 310 with respect to one surface of the window substrate 300. When stacking the windows 10 under such a condition, even if the surface of the spacer 120 and the neighbor window 10 are in contact with each other, the mounting component 310 may be spaced apart from the neighboring window 10 while being not in direct contact with the neighboring window 10. Further, even if the thickness of the first protection film 100 is reduced by the load to allow the mounting component 310 and the neighboring window 10 to be in contact with each other, the pressing force is relaxed by the thickness of the spacer 120 so as to reduce the possibility of damaging the window substrate 300 and/or the mounting component 310.

The spacer 120 may be disposed on only a part of the region of the first cover portion CV1. In this case, the surface of the first cover portion CV1, on which the spacer 120 is not disposed, may be spaced apart from the stacked windows 10. Therefore, it is possible to prevent the stacked windows 10 from being in close contact with each other, and thus, to easily separate the windows 10 from each other.

Hereinafter, the spacer 120 will be described in more detail.

Figure 5:
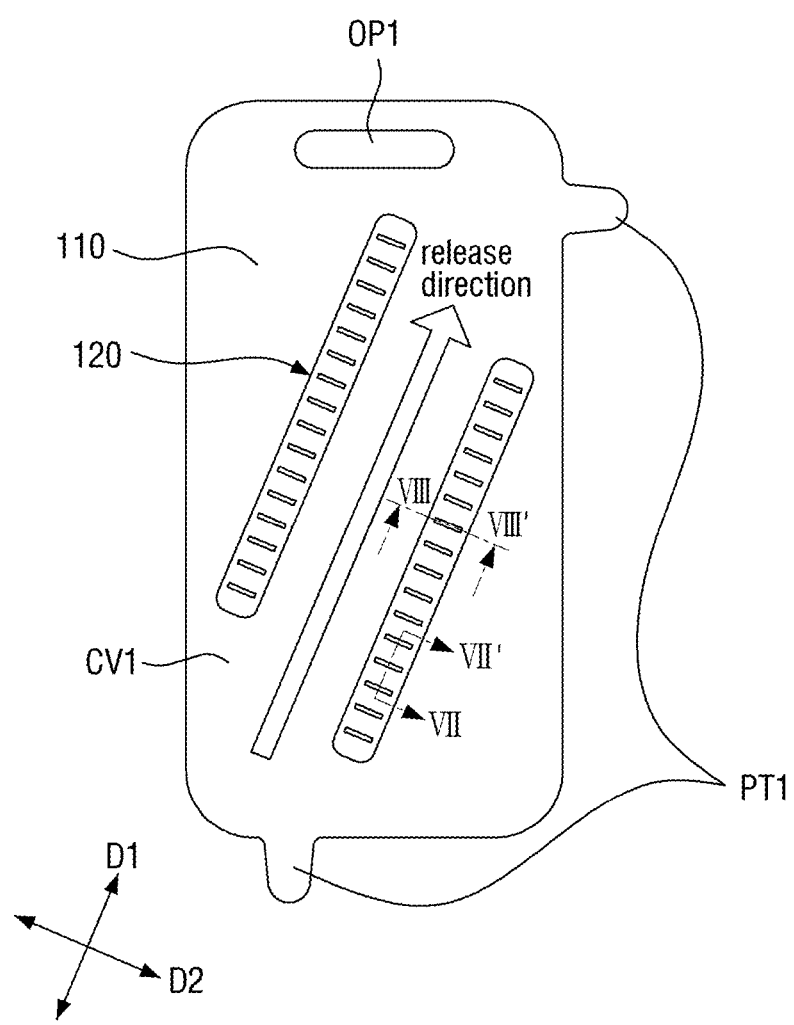
FIG. 5 is a plan view of a first protection film according to some exemplary embodiments.
Figure 6:
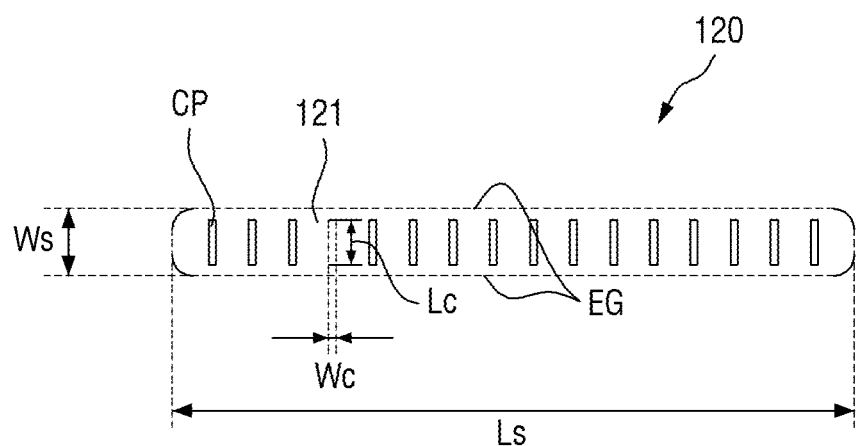
FIG. 6 is a plan view of the spacer of FIG. 5 according to some exemplary embodiments.
Figure 7:
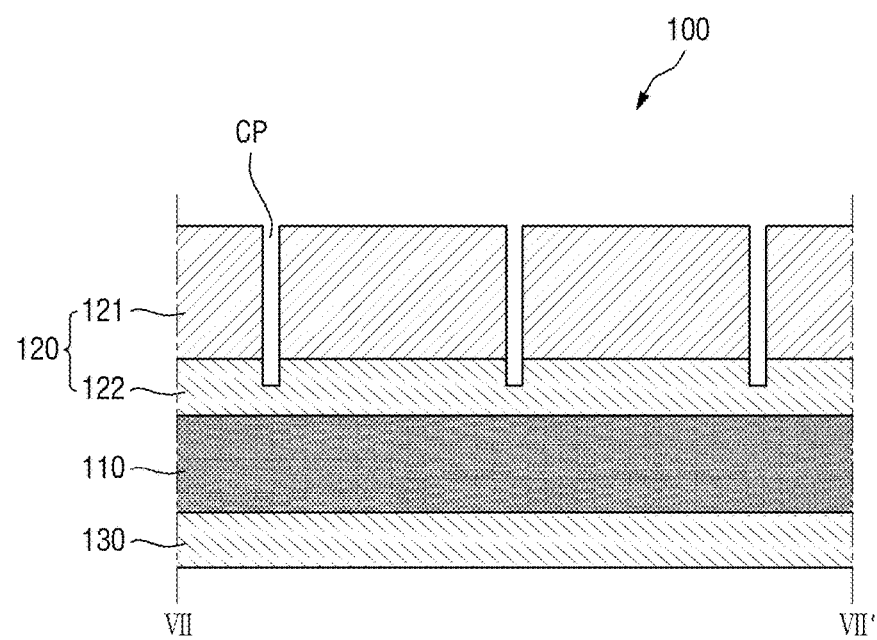
FIG. 7 is a sectional view taken along sectional line VII-VII' of FIG. 5 according to some exemplary embodiments.
Figure 8:
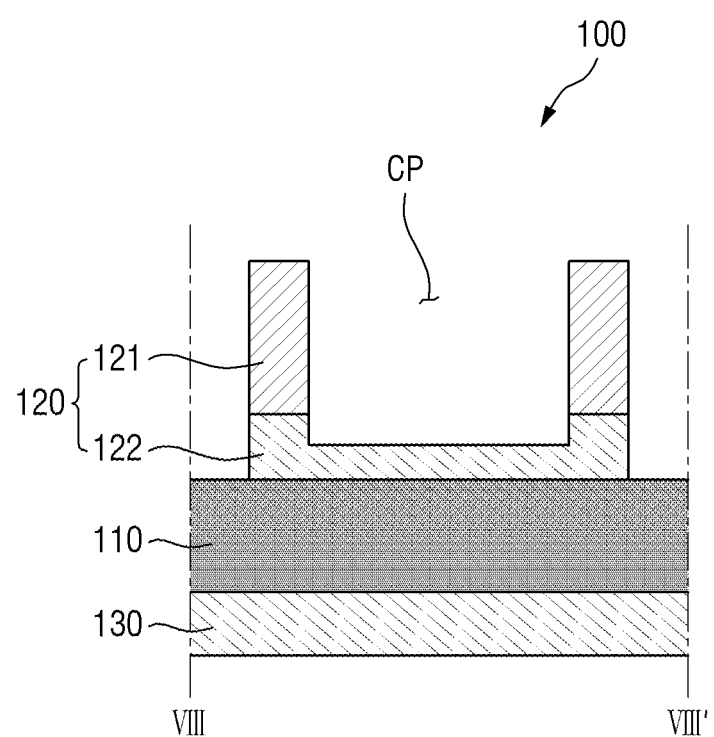
FIG. 8 is a sectional view taken along sectional line VIII-VIII' of FIG. 5 according to some exemplary embodiments.

FIG. 5 is a plan view of a first protection film according to some exemplary embodiments. FIG. 6 is a plan view of the spacer of FIG. 5 according to some exemplary embodiments. FIG. 7 is a sectional view taken along sectional line VII-VII' of FIG. 5 according to some exemplary embodiments. FIG. 8 is a sectional view taken along sectional line VIII-VIII' of FIG. 5 according to some exemplary embodiments.

Referring to FIGS. 5 to 8 together with FIGS. 1 to 4, the spacer 120 includes a support layer 121 and a first spacer bonding layer 122.

The support layer 121 serves to maintain the distance between the windows 10 when stacking the windows 10. The support layer 121 may be made of a material capable of maintaining the distance by sufficiently enduring the load in the thickness direction. That is, the support layer 121 may be made of a high-hardness material. For example, the support layer 121 may be made of a high-hardness material having a hardness value of 70 shore A or more based on shore hardness. Examples of the material of the support layer 121 may include, but are not limited to, thermoplastic polyurethane (TPU), polyethylene terephthalate (PET), polyimide (PI), polycarbonate (PC), polyethylene (PE), polypropylene (PP), polysulfone (PSF), polymethyl methacrylate (PMMA), triacetylcellulose (TAC), and a cycloolefin polymer (COP). In some exemplary embodiments, a support layer 121 made of thermoplastic polyurethane of 85 to 95 shore A may be applied.

The first spacer bonding layer 122 is disposed between the first film layer 110 and the support layer 121 to bond them. That is, the support layer 121 is attached to the first film layer 110 through the first spacer bonding layer 122. When the spacer 120 may be detached from the first film layer 110 in the process of stripping the first protection film 100, poor equipment may occur and the spacer 120 may be relatively strongly attached to the first film layer 110. For this purpose, the first spacer bonding layer 122 may contain the aforementioned material constituting the first film bonding layer 130, and may have stronger bonding force than the first film bonding layer 130.

The support layer 121 may be thicker than the first spacer bonding layer 122. For example, the thickness of the support layer 121 may be 100 μm to 1000 μm. The thickness of the first spacer bonding layer 122 may be 10 μm to 100 μm. In other words, the support layer 121 may be an order of magnitude thicker than the first spacer bonding layer 122.

The spacer 120 may have a shape extending in one direction D1 on a plane, that is, a line shape. The extending direction D1 of the spacer 120 may be the same as the stripping direction of the first protection film 100. Considering the stacking state stability of the windows 10, a plurality of line-shaped spacers 120 may be provided, and may be arranged in parallel to each other, but embodiments are not limited thereto.

The length Ls of the spacer 120 is not limited as long as the distance between the windows 10 can be maintained when stacked, such as illustrated in FIG. 4. The larger the width Ws of the spacer 120, the better the spacer 120 can maintain the distance between adjacently stacked windows 10. However, considering manufacturing costs and handling properties, the width Ws of the spacer 120 may be about ¹⁄₁₀ the length Ls of the spacer 120. For example, when the window 10 is applied to a smart phone having a size of 5 inches, the length Ls of the spacer 120 may be about 50 mm, and the width Ws of the spacer 120 may be about 5 mm, but embodiments are not limited thereto.

According to some embodiments, the spacer 120 may include at least one separation region (or separation space) formed in the depth direction from an exposed surface, as will become more apparent below. Generally, however, the spacer 120 may be at least partially separated about the at least one separation region. Since the spacer 120 can be moved in a planar direction by the separation region, even if the support layer 121, which may be made of a high-hardness material, is used to overcome the load in the vertical (or thickness) direction, flexibility can be secured at the time of stripping the first protection film 100.

In an exemplary embodiment, the separation region may include a cutting pattern CP. The cutting pattern CP is formed in the thickness direction from the exposed surface of the spacer 120, e.g., the surface of the spacer opposing a surface upon which the first spacer bonding layer 122 is disposed. The cutting pattern CP may be formed by a half-cutting method using a knife, but embodiments are not limited thereto.

The cutting pattern CP may be a line type pattern where the length Lc of the cutting pattern CP is longer than the width Wc of the cutting pattern CP. The extending direction D2 (e.g., length direction of Lc) of the cutting pattern CP may intersect the extending direction D1 of the spacer 120 and the stripping direction of the first protection film 100. The intersection angle may be 45° or more. In at least one embodiment, the extending direction D2 of the cutting pattern CP may be perpendicular (orthogonal) to the extending direction D1 of the spacer 120 and/or the stripping direction of the first protection film 100. Further, a plurality of cutting patterns CP may be arranged at regular intervals along the extending direction D1 of the spacer 120. However, embodiments are not limited thereto.

The cutting pattern CP may partially traverse the surface of the spacer 120 on a plane. When the cutting pattern CP completely traverses the surface of the spacer 120 between the both edges EG in the width Ws direction, the surface of the spacer 120 is separated from each other around the cutting pattern CP, and thus, the spacer 120 is more flexibility during a stripping process, but the spacer 120 is more easily moved individually. As such, handling properties may deteriorate at the time of attaching the spacer 120. When the cutting pattern CP partially traverses the surface of the spacer 120 on a plane, the surfaces of the spacers 120 may be integrated through the region where the cutting pattern CP is formed. From this viewpoint, one end and the other end of the cutting pattern CP may be located inward from both edges EG in the width Ws direction of the spacer 120. In this case, although the cutting pattern CP is completely surrounded by the surface of the spacer 120 on a plane, and the surface of the spacer 120 is partially separated with respect to the cutting pattern CP, the cutting pattern CP and the surface of the spacer 120 may be connected through the outside (or outer portions) of one end and the other end of the cutting pattern CP. In this manner, a balance between flexibility and handling properties can be sufficiently established.

In an embodiment, the length Lc of the cutting pattern CP may be 70% to 90% of the width Ws of the spacer 120. For example, when the width Ws of the spacer 120 is 5 mm, the length Lc of the cutting pattern CP may be 3.5 mm to 4.5 mm. The width Wc of the cutting pattern CP may be $\frac{1}{10}$ or less of the length Lc of the cutting pattern CP.

The cutting pattern CP may traverse the support layer 121 in the thickness direction. The support layer 121 is separated around the cutting pattern CP in a sectional view. Therefore, the support layer 121 can be moved in the plane direction (e.g., in the width Wc direction of the cutting pattern CP) around the cutting pattern CP. In the process of stripping the first protection film 100, stress to be applied to the spacer 120 is scattered, and flexibility is imparted so that it is possible to easily apply and secure the first protection film 100 in a narrow space and to prevent the spacer 120 from being detached from the first film layer 110.

The cutting pattern CP may extend to the interior of the first spacer bonding layer 122 in the depth direction. That is, the first spacer bonding layer 122 may be separated from one surface to a determined depth, such as seen in FIGS. 7 and 8. The cutting pattern CP may terminate in the first spacer bonding layer 122 without completely traversing to the other surface of the first spacer bonding layer 122 in the depth direction. That is, the bottom surface of the cutting pattern CP may be located in the first spacer bonding layer 122. In a sectional view, the first spacer bonding layer 122 may be partially separated by the cutting pattern CP, and the lower portion thereof may be connected without being separated by the cutting pattern CP. The first spacer bonding layer 122 may be integrally connected without being completely separated from the lower portion of the cutting pattern CP. The entire other surface of the first spacer bonding layer 122 may be connected as one without the cutting pattern CP. The length Lc of the cutting pattern CP may be the same along the depth direction. For instance, the bottom surface of the cutting pattern CP may be flat.

Hereinafter, an exemplary method of manufacturing a display device including a window substrate using the window 10 will be described in association with FIGS. 9 and 10.

Figure 9:
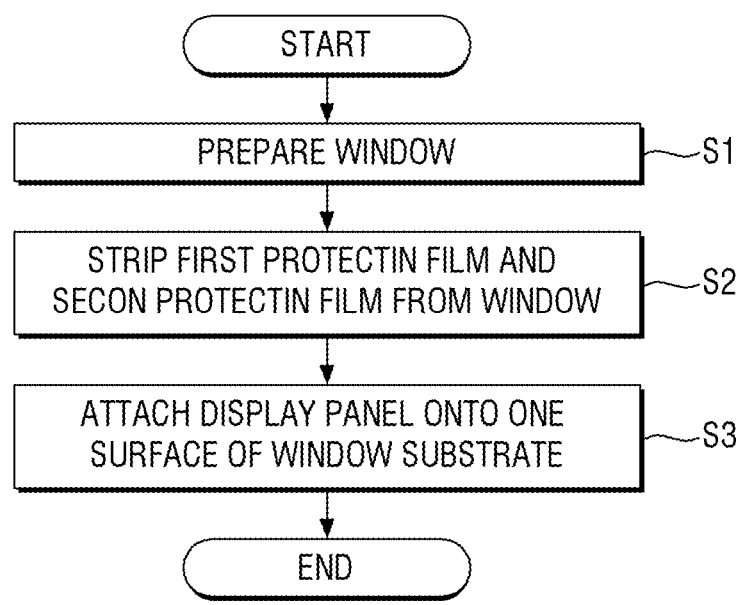
FIG. 9 is a flowchart of a method of manufacturing a display device according to some exemplary embodiments.

FIG. 9 is a flowchart of a method of manufacturing a display device according to some exemplary embodiments. FIG. 10 is a schematic view showing a process of stripping a first protection film from a window substrate according to some exemplary embodiments.

Referring to FIG. 9, the window 10 described with reference to FIGS. 1 to 8 is prepared (S1). The plurality of individually manufactured windows 10, as shown in FIG. 4, may be stacked and stored or transported. Since the distance between the stacked windows 10 are maintained by the spacer 120, damage to the mounting component 310 and/or neighboring windows 10 can be prevented. When the spacer 120 includes the high-hardness support layer 121, the distance between the window substrates 300 can be maintained despite the stacking load.

Figure 10:
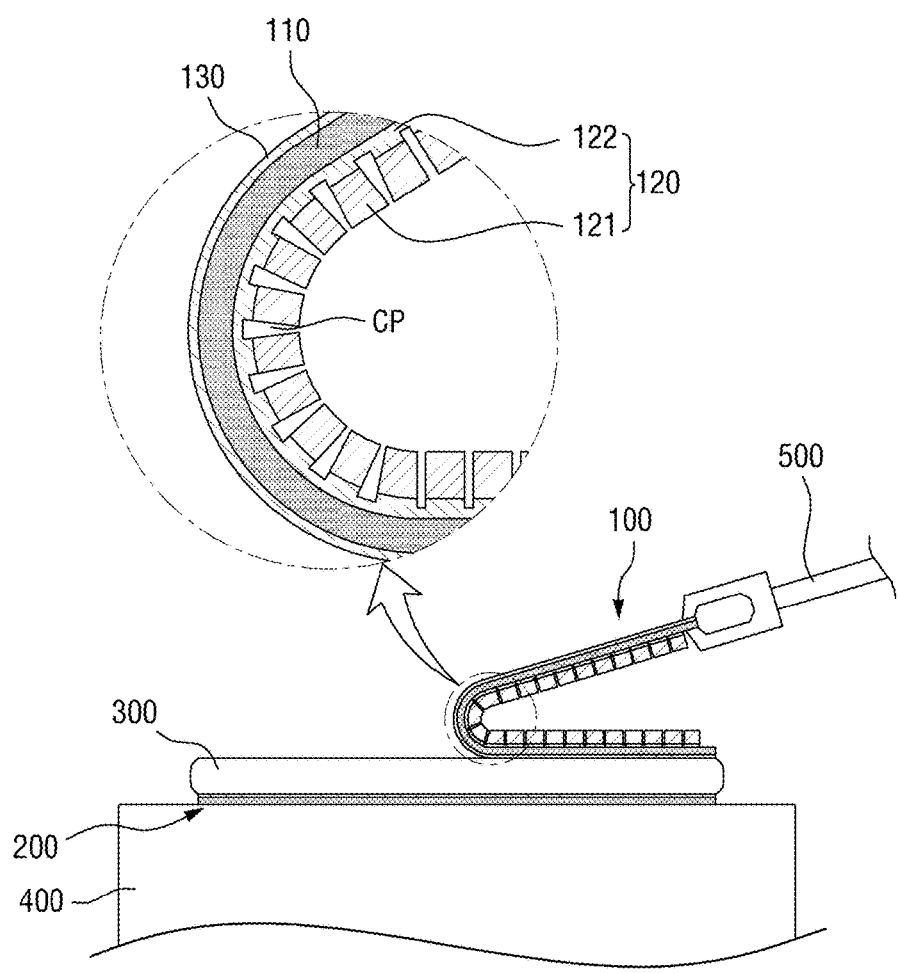
FIG. 10 is a schematic view showing a process of stripping a first protection film from a window substrate according to some exemplary embodiments.

Subsequently, the window 10 is disposed on a stage 400, such as illustrated in FIG. 10. When the windows 10 are stacked, the windows 10 may be individually separated, and then disposed on the stage 400 using a robot or the like. Subsequently, the first protection film 100 and second protection film 200 of the window 10 are stripped to expose one surface and the other surface of the window substrate 300 (S2). FIG. 10 is a schematic view showing a process of stripping the first protection film 100 from the window substrate 300.

Referring to FIGS. 4 and 10, when a stripping robot 500 performs a stripping process while gripping the first pull tab portion PT1, the first film bonding layer 130 is separated from one surface of the window substrate 300. The stripped first protection film 100 may be wound (or flexed) toward one surface (e.g., upper surface) thereof. In this case, a portion of the support layer 121 of the spacer 120 is separated by the cutting pattern CP, and partially moved, so as to secure flexibility.

For example, as shown in FIG. 10, when the first protection film 100 is stripped, the vicinity of the upper surface of the spacer 120 may undergo compressive stress, whereas the vicinity of the bottom surface of the spacer 120 may undergo tensile stress. The portion of the support layer 121 around the opening of the cutting pattern CP subjected to compressive stress may be closer to each other to release (or reduce) the corresponding stress, and the bottom portion of the cutting pattern CP subjected to tensile stress may stretch or maintain the distance to release (or reduce) the corresponding stress. The bottom portion of the cutting pattern CP is composed of the first spacer bonding layer 122, which is relatively more flexible than the support layer 121, so that tensile stress can be effectively released.

The first protection film 100 may be warped (or bent) more easily as stripping flexibility is secured by the cutting pattern CP of the spacer 120. In other words, the stripping process can proceed with a small curvature radius, and a space above the window 10 for the stripping process can be reduced, e.g., the space in which the first protection film 100 is forced into while the first protection film 100 is being stripped from the window substrate 300.

The second protection film 200 may also be stripped in the same manner. When the second protection film 200 does not include the spacer 120, the second protection film 200 may be more easily stripped as compared to the first protection film 100. There is no limitation in the order of the stripping process of the first protection film 100 and the stripping process of the second protection film 200.

Referring to FIG. 9 again, a display panel is attached on one surface of the window substrate 300 (S3). The display panel may be an organic light emitting display panel, a liquid crystal display panel, or the like. The display panel may be attached on one surface of the window substrate 300 through a light-transmitting adhesive, resin, or the like, such as an optically clear adhesive, resin, or the like. Another panel, such as a touch panel or an optical film, such as a polarizing film, may be interposed between the display panel and the window substrate 300. Since various structures and manufacturing methods related to these other structures, e.g., panels, films, etc., are widely known in the technical field, a detailed description thereof will be omitted.

Hereinafter, additional and/or alternative embodiments will be described. In the following embodiments, the same or similar components as those previously described will be referred to by the same or similar reference numerals, and a description thereof will be omitted or simplified. As such, primarily differences will be described below.

FIGS. 11, 12, 13, and 14 are sectional views of first protection films according to various exemplary embodiments. FIGS. 11 to 14 correspond to the sectional view of FIG. 7, and show that the depth of the cutting pattern CP may be varied in various ways.

Figure 11:
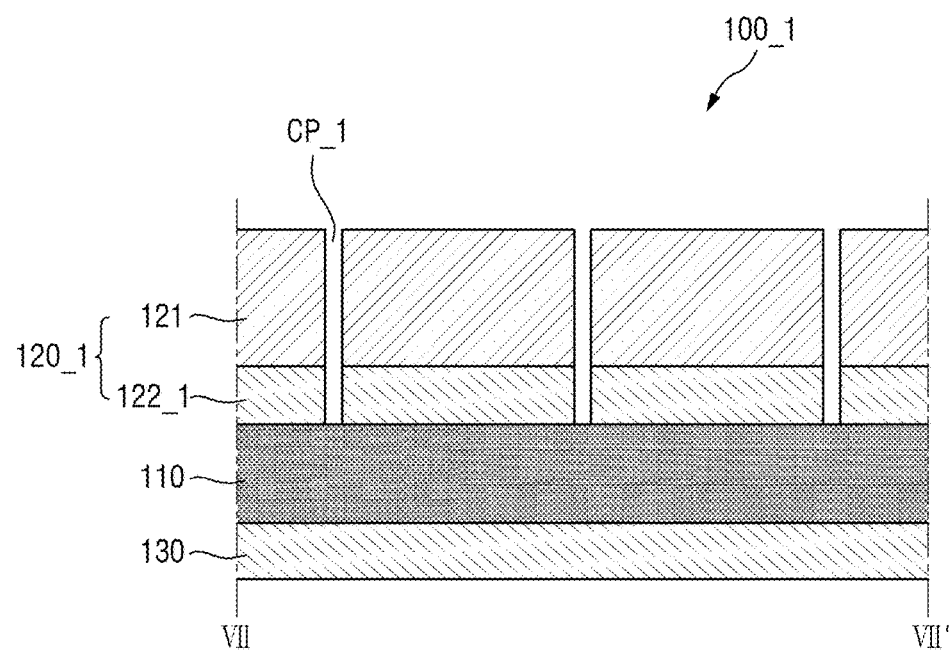
FIGS. 11, 12, 13, and 14 are sectional views of first protection films according to various exemplary embodiments.

As seen in FIG. 11, the cutting pattern CP_1 of a spacer 120_1 of a first protection film 100_1 completely traverses the support layer 121 in the thickness direction, and completely traverses the first spacer bonding layer 122_1 in the thickness direction so as to separate the spacer 120_1 around the cutting pattern CP_1. Accordingly, the depth of the cutting pattern CP_1 is greater than the depth of the cutting pattern CP in FIG. 7.

Figure 12:
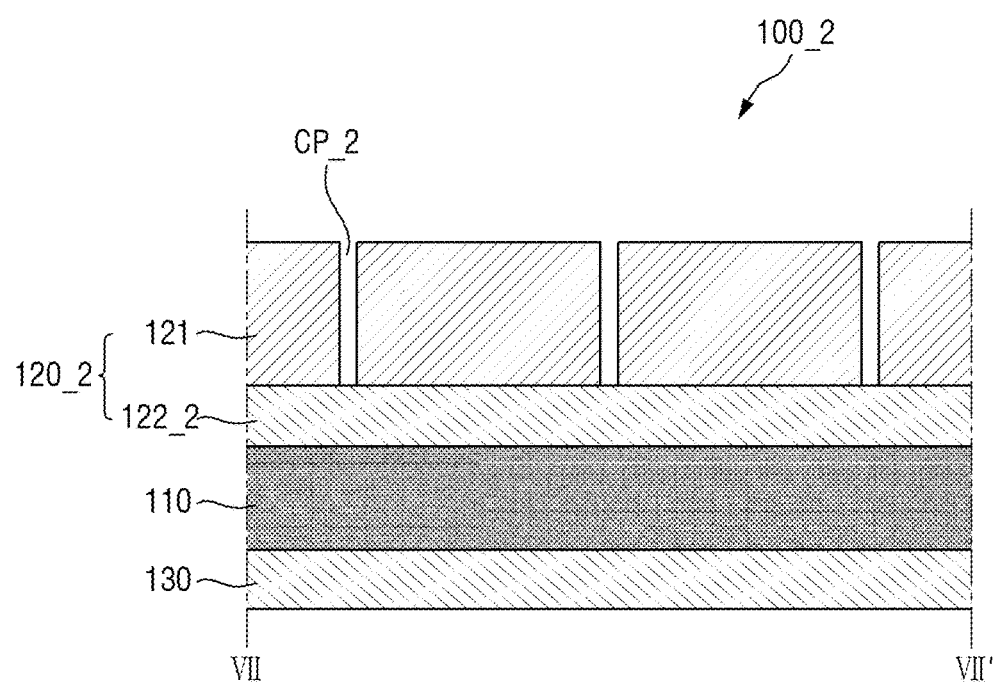

Referring to FIG. 12, the cutting pattern CP_2 of a spacer 120_2 of a first protection film 100_2 completely traverses the support layer 121 in the thickness direction, but does not extend into the first spacer bonding layer 122_2. Accordingly, the depth of the cutting pattern CP_2 is smaller than the depth of the cutting pattern CP in FIG. 7.

Figure 13:
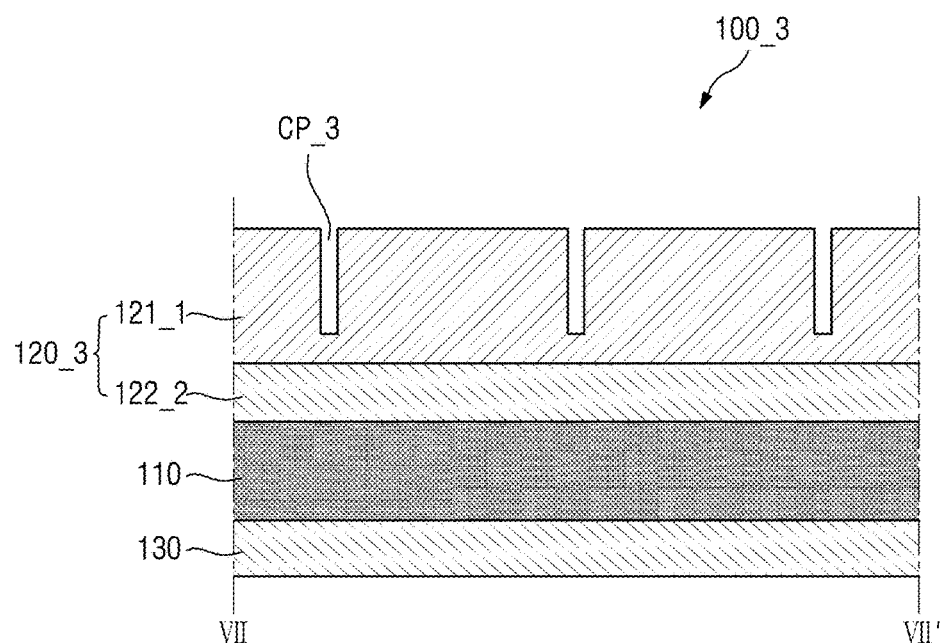

With reference to FIG. 13, the cutting pattern CP_3 of a spacer 120_3 of a first protection film 100_3 does not completely traverse the support layer 121_1 in the thickness direction, and terminates in the support layer 121_1. As such, the cutting pattern CP_3 does not extend into the first spacer bonding layer 122_2. Accordingly, the depth of the cutting pattern CP_3 is smaller than the depth of the cutting pattern CP_2 in the embodiment of FIG. 12.

Figure 14:
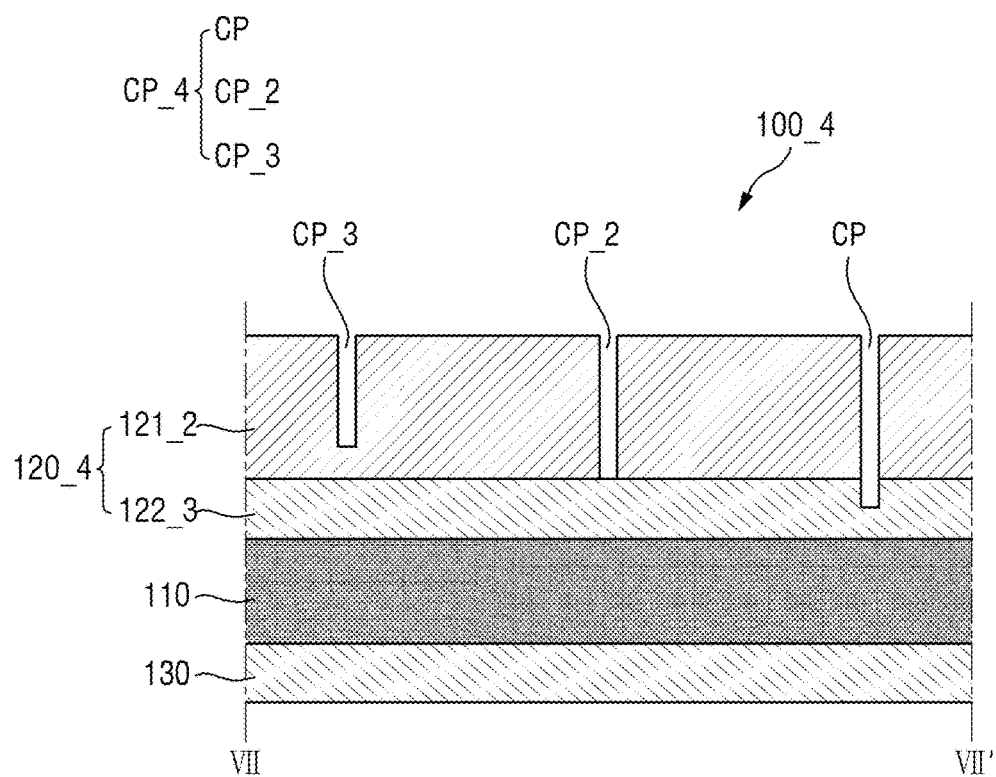

Adverting to FIG. 14, at least some the cutting patterns CP_4 of a spacer 120_4 of a first protection film 100_4 may have different depths from each other. Illustratively, FIG. 14 shows a case where one cutting pattern CP_3 does not completely traverse the support layer 121_2 in the thickness direction and terminates in the support layer 121_2 as shown in FIG. 13; another cutting pattern CP_2 completely traverses the support layer 121_2 in the thickness direction, but does not extend into the first spacer bonding layer 122_3 as shown in FIG. 12; and still another cutting pattern CP completely traverses the support layer 121_2 in the thickness direction and extends into the interior of the first spacer bonding layer 122_3 as shown in FIG. 7. In this manner, at least some cutting patterns CP_4 having different depths from each other may be intentionally or unintentionally formed, such as unintentionally formed according to process deviations at the time of forming cutting patterns CP.

Figure 17:
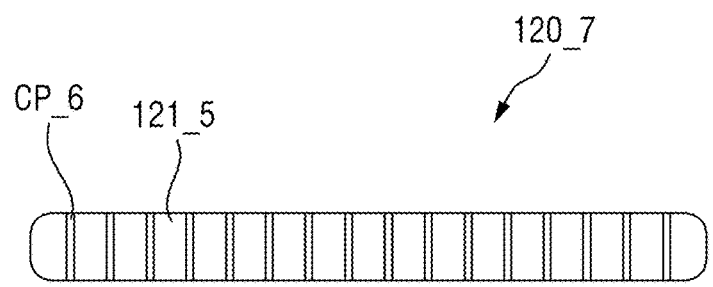
FIG. 17 is a plan view of a spacer according to some exemplary embodiments.

As previously mentioned, the depth of the cutting patterns CP_4 are related to the flexibility and handling properties in the stripping direction. Like as described in association with FIG. 11, when the cutting pattern CP_1 completely traverses the support layer 121 and the first spacer bonding layer 122_1, flexibility may be improved, whereas handling properties may be somewhat reduced. To ensure better handling properties, embodiments may include cutting patterns CP integrated with the surface of the spacer 120 by partially traversing the surface of the spacer 120 on a plane, as shown in FIG. 6. As shown in FIG. 12, when the depth of the cutting pattern CP_2 is relatively smaller than cutting patterns CP, the flexibility in the stripping direction may be somewhat reduced, whereas the handling properties may be increased. Thus, as shown in FIG. 17 (described later), to improve flexibility, embodiments may include forming of cutting patterns CP_6 to completely traverse the surface of the spacer 120_7.

Figure 15:
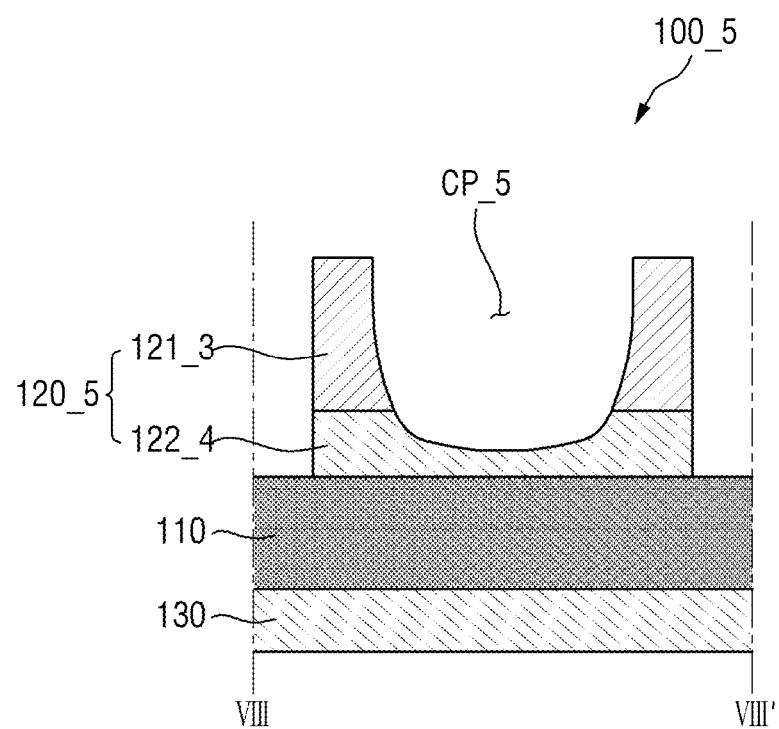
FIG. 15 is a sectional view of a first protection film according to some exemplary embodiments.

FIG. 15 is a sectional view of a first protection film according to some exemplary embodiments. FIG. 15 corresponds to the sectional view of FIG. 8, and shows that the length of the cutting pattern CP_5 can be varied depending on a depth of the cutting pattern CP_5.

Referring to FIG. 15, the depth of the cutting pattern CP_5 of a spacer 120_5 of a first protection film 100_5 increases in the thickness direction from a first sidewall to a central portion and increases in the thickness direction from the central portion to a second sidewall; however, embodiments are not limited thereto. For instance, the depth of the cutting patterns CP_5 may vary in other manners in relation to the width and/or length of the spacer 120_5, whether linearly, arcuately, randomly etc. As seen, however, in FIG. 15, the sidewall of the support layer 121_3 and/or the first spacer bonding layer 122_4 around the cutting pattern CP_5 may have a curved surface such that the depth of the cutting pattern CP_5 arcuately varies. The bottom surface of the cutting pattern CP_5 may be flat, but may have a concave shape as shown in FIG. 15. When the depth of the cutting pattern CP_5 decreases, the bottom portions of the spacer 120_5 are strongly bonded to each other, and as such, handling properties can be increased. It is contemplated, however, that depth direction shapes of various other cutting patterns may be utilized, and can be adjusted by the shape of a knife (or other cutting tool) utilized to form a corresponding cutting pattern.

Figure 16:
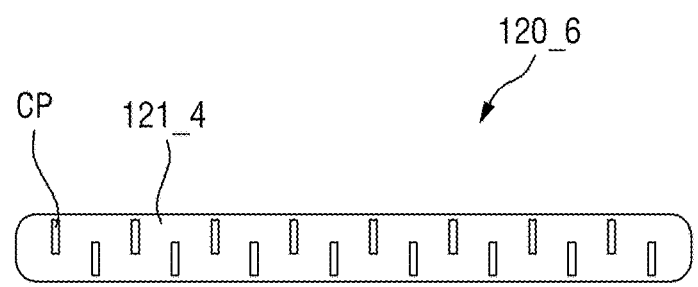
FIG. 16 is a plan view of a spacer according to some exemplary embodiments

FIG. 16 is a plan view of a spacer according to some exemplary embodiments.

Referring to FIG. 16, a spacer 120_6 is different from the spacer 120 of FIG. 6 in that cutting patterns CP are arranged to be staggered along the length direction of the support layer 121_4, and, thereby, along the length direction of the spacer 120_6. To this end, a sufficient distance between one end of the cutting pattern CP and one edge of the spacer 120_6 in the width direction is ensured, thereby ensuring the flexibility in the stripping direction while securing the surface integrity of the spacer 120_6. Although FIG. 16 illustrates the cutting patterns CP arranged in two rows, the cutting patterns CP may be arranged in two or more rows, or any other configuration, e.g., a matrix configuration, randomly, etc.

FIG. 17 is a plan view of a spacer according to some exemplary embodiments.

As seen in FIG. 17, at least one end of the cutting pattern CP_6 of a spacer 120_7 may extend to the edge of the spacer 120_7 in the width direction. When one end of the cutting pattern extends to the edge of the spacer 120_7 in the width direction, the surface of the spacer 120_7 is not physically connected at the corresponding edge, so that the movability of the separated support layer 121 can increase. That is, flexibility is improved. When both ends of the cutting pattern CP_6 extend to the edge of the spacer 120_7, in other words, when the cutting pattern CP_6 completely traverses the surface of the spacer 120_7 on a plane, it goes without saying that the movability of the support layer 121_5 will further increase. When it is necessary to complement handling properties, the sectional structures may be integrally connected at the lower portion of a corresponding spacer, such as shown in FIGS. 7, 12, and 13.

Figure 18:
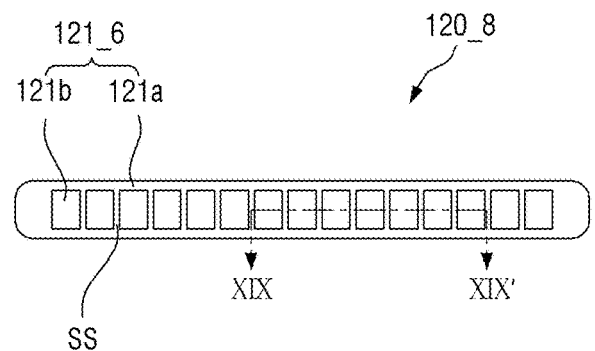
FIG. 18 is a plan view of a spacer according to some exemplary embodiments.
Figure 19:
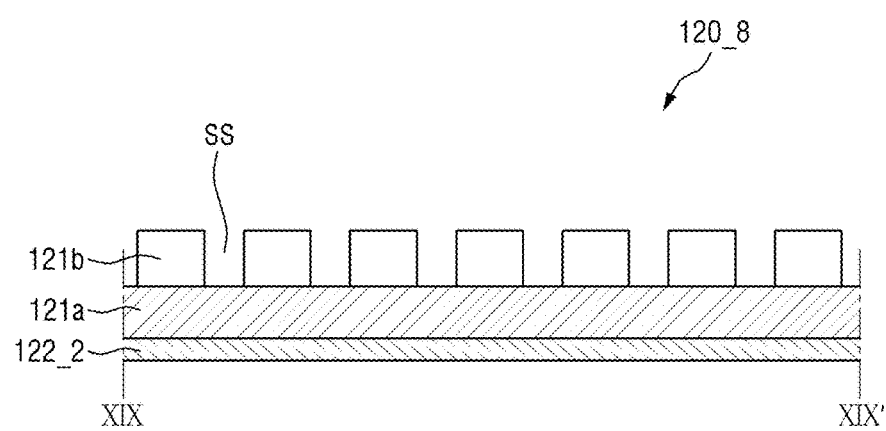
FIG. 19 is a sectional view taken along sectional line XIX-XIX' of FIG. 18 according to some exemplary embodiments.

FIG. 18 is a plan view of a spacer according to some exemplary embodiments. FIG. 19 is a sectional view taken along sectional line XIX-XIX' of FIG. 18 according to some exemplary embodiments.

Referring to FIGS. 18 and 19, the separation region of a spacer 120_8 includes a first spacer bonding layer 122_2 and a support layer 121_6, including support base layer 121a and a plurality of support patterns 121b.

The support base layer 121a is disposed on one surface of the first spacer bonding layer 122_2. The support base layer 121a may have substantially the same shape as the first spacer bonding layer 122_2. The plurality of support patterns 121b are disposed on one surface of the support base layer 121a. The support patterns 121b may be formed on the support base layer 121a by a patterning method. The patterning method may include, but is not limited to, at least one of an etching process, an imprint process, an inkjet printing process, and a gravure printing process.

The support patterns 121b are disposed to be spaced apart from each other. The separation region includes a spacing space SS between the adjacent support patterns 12 lb. The spacing space SS may serve substantially the same function as the cutting pattern CP. That is, the flexibility in the stripping direction can be secured by the spacing space SS. The spacing space SS may have a shape extending in a direction intersecting the extending direction of the spacer 120_8 and/or the stripping direction of a corresponding first protection film, for example, a shape extending in a vertical (e.g., thickness) direction.

The support base layer 121a and the support pattern 121b may be made of the material constituting the support layer 121, but embodiments are not limited thereto. The support base layer 121a and the support pattern 121b may be made of the same material, but may also be made of different materials. Although not shown in the drawings, the support patterns 121b may also be directly formed on one surface of the first spacer bonding layer 122_2 without forming the support base layer 121a.

Figure 20:
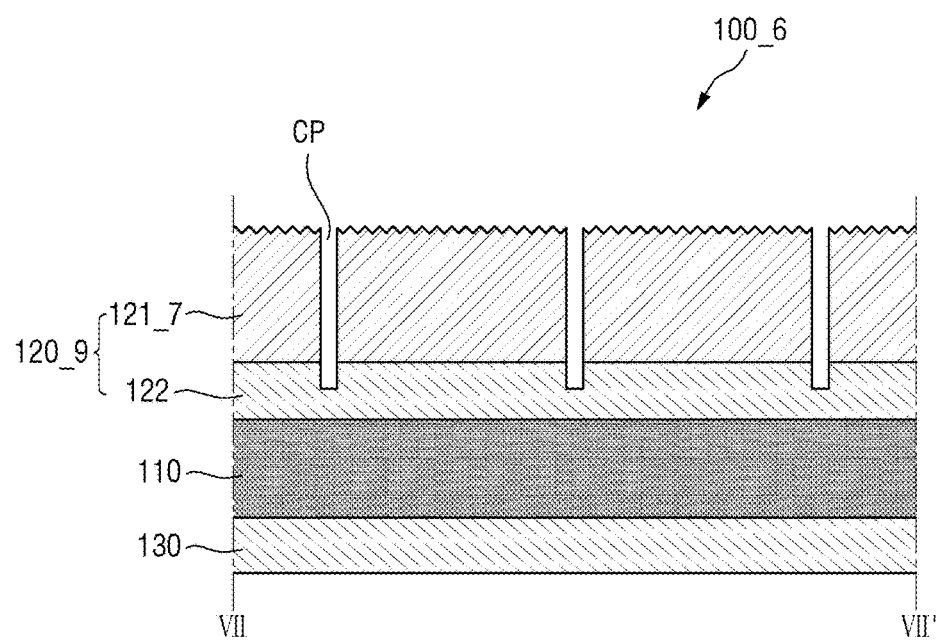
FIG. 20 is a sectional view of a first protection film according to some exemplary embodiments.

FIG. 20 is a sectional view of a first protection film according to some exemplary embodiments. FIG. 20 corresponds to the sectional view of FIG. 7.

Referring to FIG. 20, a first protection film 100_6 is different from the first protection film 100 of FIG. 7 in that a spacer 120_9 includes surface unevenness. When the surface of a support layer 121_7 is the surface of the spacer 120_9, surface unevenness is formed on the surface of the support layer 121_7.

When the plurality of windows 10 are stacked as shown in FIG. 4, the surface of the spacer 120_9 is in contact with the neighboring window 10. When the spacer 120_9 has surface unevenness, convex portions may be in direct contact with the neighboring window 10, but the concave portions are spaced apart from the neighboring window 10 such that an air gap is formed between the convex portion and the concave portion. Therefore, it is possible to prevent the neighboring window 10 and the surface of the spacer 120_9 from being closer to each other, so that it is easy to separate the windows 10 from each other.

Figure 21:
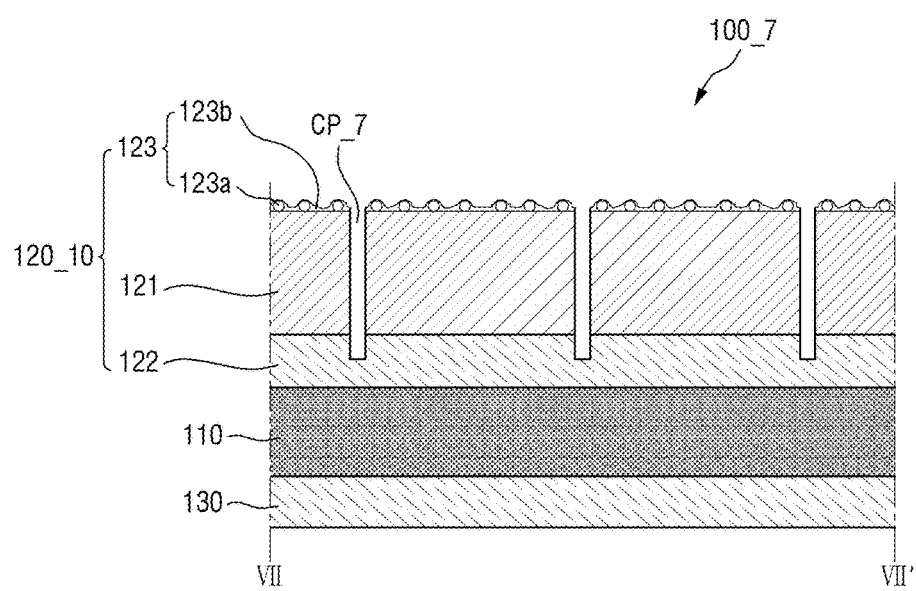
FIG. 21 is a sectional view of a first protection film according to some exemplary embodiments.

FIG. 21 is a sectional view of a first protection film according to some exemplary embodiments. FIG. 21 corresponds to the sectional view of FIG. 7.

Referring to FIG. 21, a first protection film 100_7 is different from that of the first protection film 100 of FIG. 7 in that a spacer 120_10 further includes a mat layer 123 on the support layer 121. The mat layer 123 includes surface unevenness. In order to form the surface unevenness, the mat layer 123 may include a binder 123b and beads 123a dispersed in the binder 123b. The beads 123a may be organic beads or inorganic beads. The mat layer 123 may be formed by coating or the like. The cutting pattern CP_7 penetrates the mat layer 123 and extends into the support layer 121 and/or the first spacer bonding layer 122 in the thickness direction.

When the mat layer 123 having surface unevenness is disposed on the support layer 121, similarly to as described in association with FIG. 20, the surface of the spacer 120_10 may also have unevenness. Therefore, it is possible to prevent the neighboring window 10 and the surface of the spacer 120_10 from being closer to each other, so that it is easy to separate the windows 10 from each other when stacked as illustrated in FIG. 4.

Figure 22:
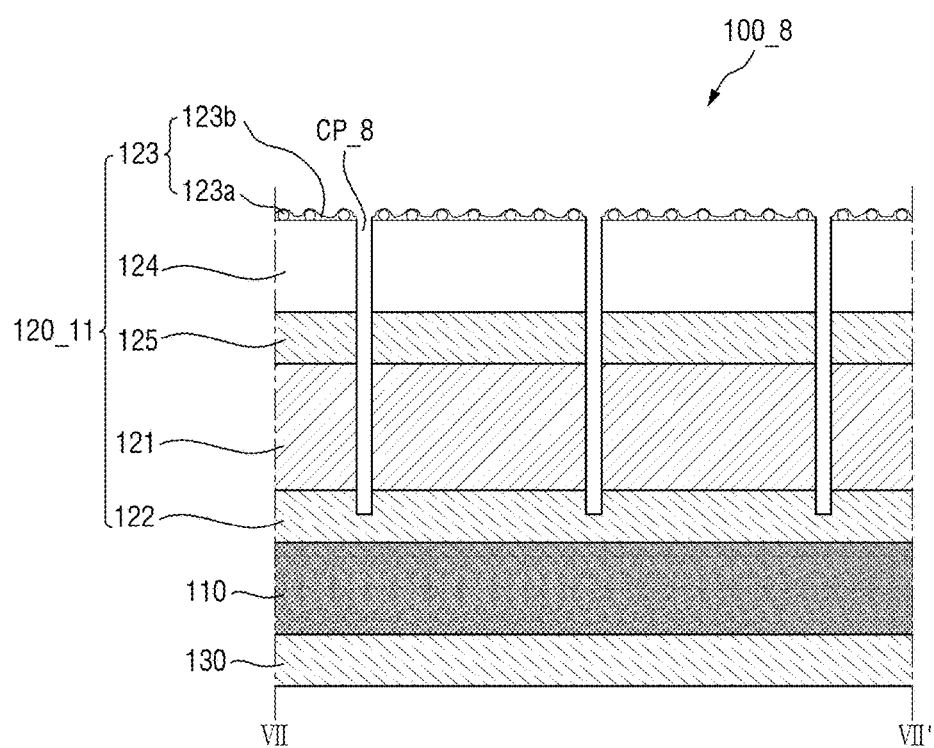
FIG. 22 is a sectional view of a first protection film according to some exemplary embodiments.

FIG. 22 is a sectional view of a first protection film according to some exemplary embodiments. FIG. 22 corresponds to the sectional view of FIG. 7.

Referring to FIG. 22, a first protection film 100_8 is different from that of the first protection film 100_7 of FIG. 21 in that the mat layer 123 is provided in the form of a mat film. That is, a spacer 120_11 further includes a second spacer bonding layer 125 disposed on the support layer 121, a mat substrate 124 disposed on the second spacer bonding layer 125, and a mat layer 123 disposed on the mat substrate 124. The mat layer 123 may be formed on the mat substrate 124, and then laminated on the support layer 121 through the second spacer bonding layer 125. The cutting pattern CP_8 penetrates the mat layer 123, the mat substrate 124, and the second spacer bonding layer 125, and extends to the support layer 121 and/or the first spacer bonding layer 122 in the thickness direction.

According to some embodiments, since unevenness is formed on the surface of the spacer 120_11 by the mat layer 123, it is possible to prevent neighboring windows 10 and the surface of the spacer 120_11 from being closer to each other, so that it is easy to separate the windows 10 from each other when stacked as illustrated in FIG. 4.

Figure 23:
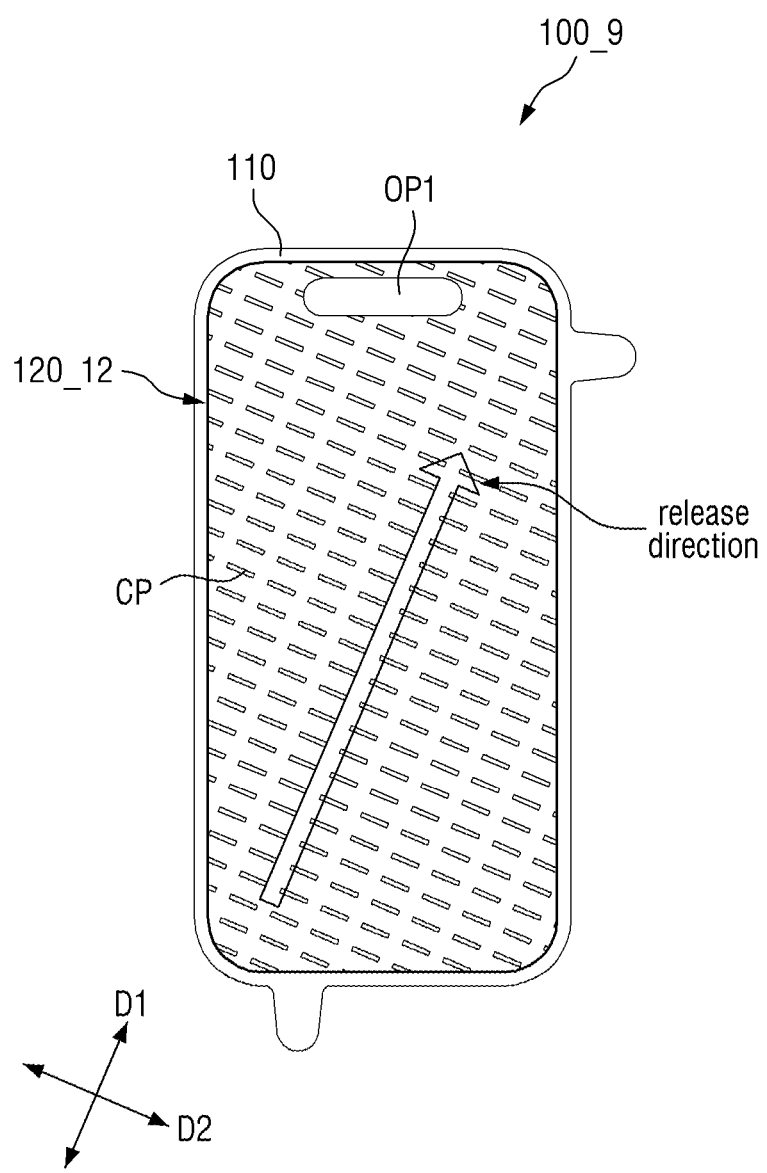
FIG. 23 is a plan view of a first protection film according to some exemplary embodiments.

FIG. 23 is a plan view of a first protection film according to some exemplary embodiments. That is, FIG. 23 illustrate that a spacer 120_12 of a first protection film 100_9 may be formed in a surface type configuration instead of a line type configuration.

Referring to FIG. 23, the spacer 120_12 is disposed on the entire (or substantially entire) surface of the first cover portion CV1 (see FIG. 2) of the first film layer 110. The cutting pattern CP of the spacer 120_12 may be formed over the entire surface of the spacer 120_12. The extending direction D2 of each cutting pattern CP may have a shape extending in a direction perpendicular to the stripping direction D1 of the first protection film 100. Therefore, flexibility can be imparted in the stripping direction. Although FIG. 23 illustrates a case where the cutting patterns CP having a determined length are arranged to have a plurality of rows and a plurality of columns, the cutting patterns CP may be arranged in one row as shown in FIG. 5. In this case, each of the cutting patterns CP may have a sufficient length to traverse the entire surface of the first cover portion CV1. It is contemplated, however, that the cutting patterns CP may have any other suitable arrangement over the surface of the spacer 120_12.

According to various embodiments, since the spacer 120_12 is disposed on the entire surface of the first cover portion CV1, the handling properties of the spacer 120_12 may be further improved. Additionally, the configuration of the spacer 120_12 may scatter (or distribute) the load better during the stacking of the windows 10 as seen, for example, in FIG. 4.

Figure 24:
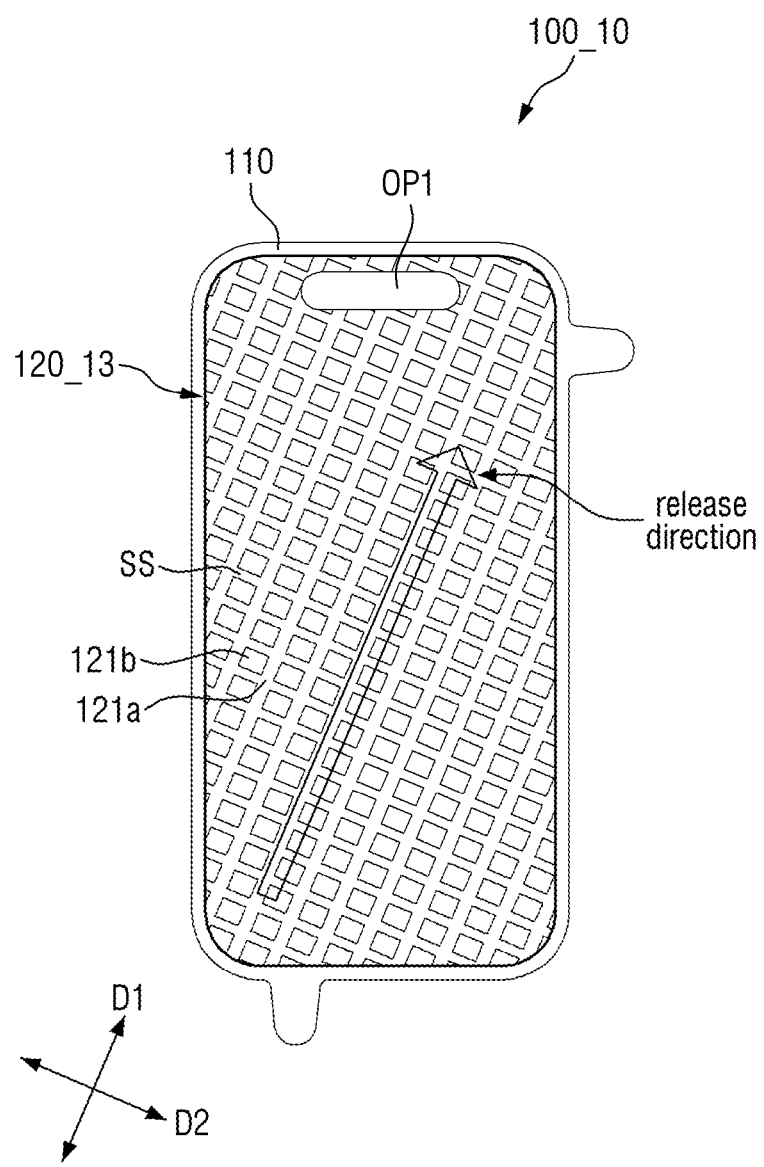
FIG. 24 is a plan view of a first protection film according to some exemplary embodiments.

FIG. 24 is a plan view of a first protection film according to some exemplary embodiments. The first protection film 100_10 of FIG. 24 is different from the first protection film 100_9 of FIG. 23 in that a spacer 120_13 of the first protection film 100_10 includes an arrangement of the support patterns 121b on the support base layer 121a.

Referring to FIG. 24, the spacer 120_13 is disposed on the entire (or substantially entire) surface of the first cover portion CV1 (see FIG. 2) of the first film layer 110. A plurality of support patterns 121b are arranged to be spaced apart from each other. At least a part of the spacing space SS between the adjacent support patterns 121b may have a shape extending in a direction perpendicular to the stripping direction D1 of the first protection film 100. Therefore, flexibility can be imparted in the stripping direction D1.

Although FIG. 24 illustrates a case where the support patterns 121b having a determined length are arranged to have a plurality of rows and a plurality of columns, the support patterns 121b may be arranged in one row as shown in FIG. 18. In this case, each of the support patterns 121b may have a sufficient length to traverse the entire surface of the first cover portion CV1. It is contemplated, however, that the support patterns 121b may have any other suitable arrangement over the surface of the spacer 120_13.

According to some embodiments, since the spacer 120_13 is disposed on the entire surface of the first cover portion CV1, the handling properties of the spacer 120_13 may be improved. Additionally, the configuration of the spacer 120_13 may scatter (or distribute) the load better during the stacking of the windows 10 as seen, for example, in FIG. 4.

Figure 25:
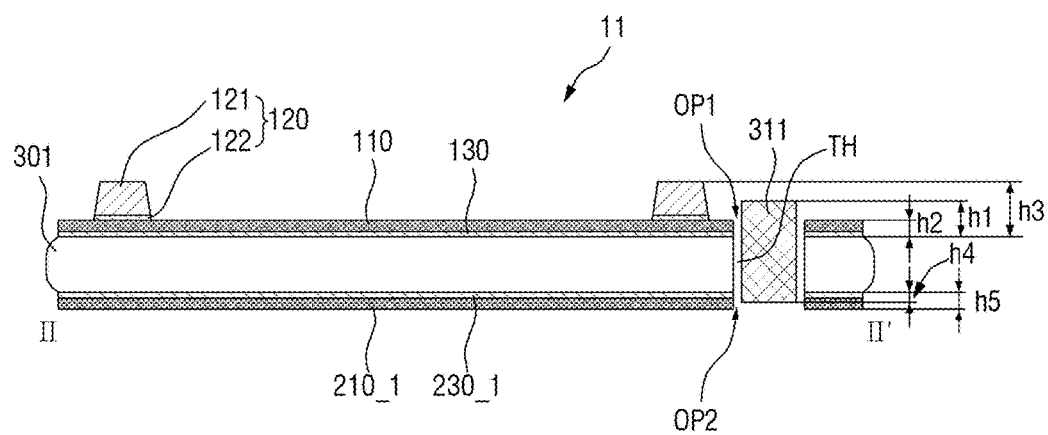
FIG. 25 is a sectional view of a window according to some exemplary is embodiments.

FIG. 25 is a sectional view of a window according to some exemplary embodiments. FIG. 25 corresponds to the sectional view of FIG. 3.

Referring to FIG. 25, a window 11 is different from the window 10 of FIG. 3 in that a window substrate 301 includes a through-hole TH. A mounting component 311 is mounted in the through-hole TH. The mounting component 311 protrudes in the thickness direction from the surface of the window substrate 301. For instance, the mounting component 311 protrudes in the thickness direction from one surface of the window substrate 301 to another surface of the window substrate 301. Since this configuration is substantially the same as that in the embodiment of FIG. 3, a duplicative description will be omitted. Primarily differences will be described below.

The mounting component 311 may also protrude in the thickness direction from the other surface of the window substrate 301. In this case, the second cover portion CV2 (see FIG. 2) of the second film layer 210_1 may expose the mounting component 311 without covering the mounting component 311. For this purpose, the second cover portion CV2 may include a second opening OP2. The second opening OP2 may be substantially the same as the aforementioned first opening OP1 of the first cover portion CV1. In this manner, each of the first and second bonding film layers 130 and 230_1 may include corresponding openings overlapping the first and second openings OP1 and OP2.

A height h4 of the other surface of the mounting component 311 with reference to the other surface of the window substrate 301 may be smaller than the height h1 of one surface of the mounting component 311 with reference to one surface of the window substrate 301. Further, the height h4 of the other surface of the mounting component 311 with reference to the other surface of the window substrate 301 may be smaller than a height h5 of the surface of the second film layer 210_1 in the second cover portion CV2. That is, the mounting component 311 may not protrude in the thickness direction from the second cover portion CV2. Therefore, even in the case of stacking the windows 10, a possibility of the other surface of the mounting component 311 coming into contact with a neighboring window 10 is low such that the provision of the spacer 120 may be omitted. When the other surface of the mounting component 311 protrudes in the thickness direction from the second cover portion CV2, the provision of the spacer 120 in the second protection film 200 may also be utilized.

Figure 26:
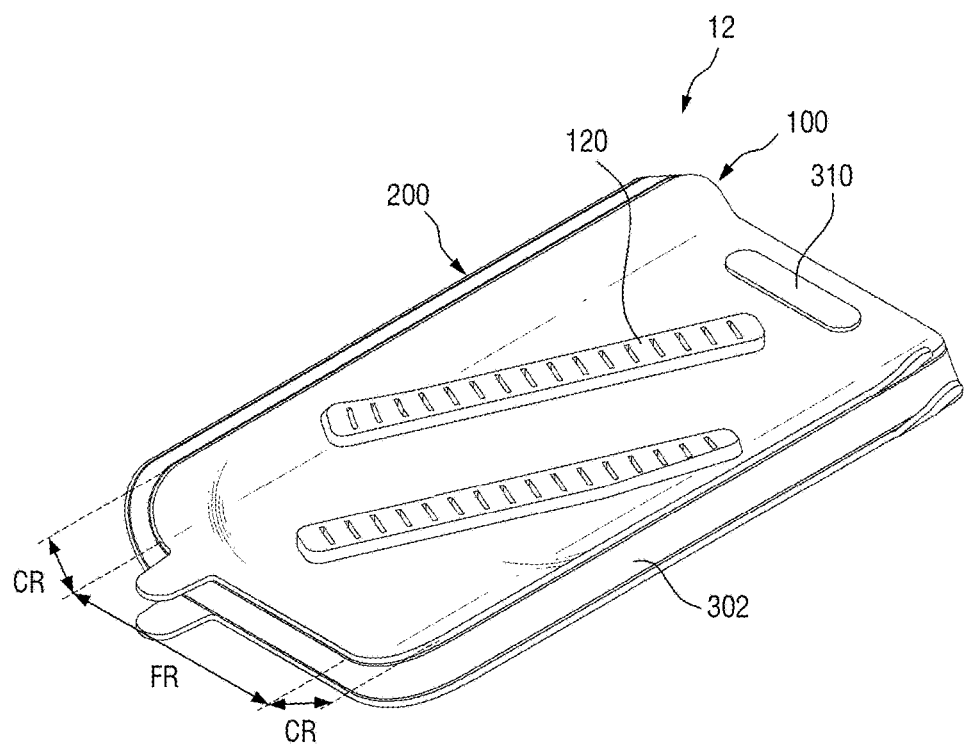
FIG. 26 is a perspective view of a window according to some exemplary embodiments.

FIG. 26 is a perspective view of a window according to some exemplary embodiments. It is exemplified that a window 12 may be warped or flexed.

Referring to FIG. 26, a window 12 may include a flat portion FR and at least one curved portion CR. Although the side surface shape of the window substrate 300 and the window 10 including the window substrate 300 may be flat as shown in FIG. 1, it may be warped depending on the shape of a display device. That is, as shown in FIG. 26, the vicinity of both long sides of the window substrate 302 may be curved in one plane direction. The window substrate 302 may be divided into a flat portion FR at the center thereof and curved portions CR around both long sides. The first protection film 100 and second protection film 200 attached to the warped window substrate 302 may also be warped together with the window substrate 302 depending on the shape of the window substrate 302.

Even in the case where the window 12 is warped, when windows 12 are stacked similarly to as shown in FIG. 4, the mounting component 310 and a neighboring window 12 may come into contact with each other. As such, the spacer 120 may be utilized to prevent such contact. The window substrates 302 can be spaced apart from each other by the spacer 120, and the flexibility in the stripping direction can be improved by the separation region formed in the spacer 120, and are functions previously described. As such, a redundant description will be omitted. The window substrate 302 may also be warped in various manners other than the manner illustrated in FIG. 26.

According to various exemplary embodiments, flexibility of a protection film in a stripping direction can be secured by a separation region even if a spacer made of a high-hardness material is used to endure load in stacking (e.g., vertical) direction.

Although certain exemplary embodiments and implementations have been described herein, other embodiments and modifications will be apparent from this description. Accordingly, the inventive concepts are not limited to such embodiments, but rather to the broader scope of the presented claims and various obvious modifications and equivalent arrangements.

What is claimed is:

1. A protection film, comprising:
 a film layer; and
 a spacer disposed on a surface of the film layer, the spacer comprising at least one separation region formed in a thickness direction from a surface of the spacer.

2. The protection film of claim 1, wherein the spacer comprises:
 a spacer bonding layer disposed on the surface of the film layer; and
 a support layer disposed on the spacer bonding layer.

3. The protection film of claim 2, wherein:
 the at least one separation region comprises a cutting pattern; and
 the cutting pattern is formed in the thickness direction from a surface of the support layer.

4. The protection film of claim 3, wherein the cutting pattern completely extends through the support layer in the thickness direction.

5. The protection film of claim 4, wherein the cutting pattern extends to an interior region of the spacer bonding layer.

6. The protection film of claim 3, wherein:
a shape of the spacer extends in a first direction on a plane; and
a shape of the cutting pattern extends in a second direction intersecting the first direction.

7. The protection film of claim 6, wherein the first direction and the second direction are orthogonal to each other.

8. The protection film of claim 6, wherein:
a first end and a second end opposing the first end of the cutting pattern are disposed, in a width direction, inwardly from opposing edges of the spacer; and
the cutting pattern is, when viewed in the thickness direction, completely surrounded by the surface of the spacer.

9. The protection film of claim 8, wherein the cutting pattern completely extends through the spacer bonding layer in the thickness direction.

10. The protection film of claim 6, wherein a first end of the cutting pattern is, in a width direction, disposed at an edge of the spacer.

11. The protection film of claim 10, wherein:
opposing ends of the cutting pattern are disposed at opposing edges of the spacer in a width direction and separate, when viewed in the thickness direction, the surface of the spacer;
the cutting pattern overlaps the spacer bonding layer;
portions of the spacer bonding layer disposed at sides of the cutting pattern are integrally connected without being completely separated.

12. The protection film of claim 6, wherein a hardness of the support layer is greater than or equal to 70 shore A.

13. The protection film of claim 3, wherein the spacer comprises surface unevenness.

14. The protection film of claim 1, wherein:
the spacer comprises:
a spacer bonding layer disposed on the surface of the film layer; and
support patterns disposed on the spacer bonding layer, the support patterns being spaced apart from each other; and
the at least one separation region comprises a spacing space between adjacent support patterns among the support patterns.

15. The protection film of claim 14, wherein:
a shape of the spacer extends in a first direction on a plane; and
a shape of the spacing space extends in a second direction intersecting the first direction.

16. A window, comprising:
a window substrate; and
a first protection film disposed on a surface of the window substrate,
wherein the first protection film comprises:
a first film layer; and
a spacer disposed on a surface of the first film layer, the spacer comprising at least one separation region formed in a thickness direction from a surface of the spacer.

17. The window of claim 16, wherein the spacer comprises:
a spacer bonding layer disposed on the surface of the first film layer; and
a support layer disposed on the spacer bonding layer.

18. The window of claim 17, wherein:
the at least one separation region comprises a cutting pattern; and
the cutting pattern is formed in the thickness direction from a surface of the support layer.

19. The window of claim 18, wherein the cutting pattern completely extends through the support layer in the thickness direction.

20. The window of claim 19, wherein the cutting pattern extends to an interior region of the spacer bonding layer.

21. The window of claim 18, wherein:
a shape of the spacer extends in a first direction on a plane; and
a shape of the cutting pattern extends in a second direction intersecting the first direction.

22. The window of claim 21, further comprising:
a mounting component protruding in the thickness direction from the surface of the window substrate,
wherein, with respect to the surface of the window substrate, a height of a surface of the mounting component is higher than a height of the surface of the first film layer and lower than a height of the surface of the spacer.

23. The window of claim 16, wherein:
the spacer comprises:
a spacer bonding layer disposed on the surface of the first film layer; and
support patterns disposed on the spacer bonding layer, the support patterns being spaced apart from each other; and
the at least one separation region comprises a spacing space between adjacent support patterns among the support patterns.

24. The window of claim 23, wherein:
a shape of the spacer extends in a first direction on a plane; and
a shape of the spacing space extends in a second direction intersecting the first direction.

25. The window of claim 16, further comprising:
a second protection film disposed on another surface of the window substrate, the another surface opposing the surface of the window substrate.

26. A method of manufacturing a display device, comprising:
preparing a window, the window comprising:
a window substrate; and
a protection film disposed on a surface of the window substrate; and
stripping the protection film from the window substrate,
wherein the protection film comprises:
a film layer; and
a spacer disposed on a surface of the film layer, the spacer comprising at least one separation region formed in a thickness direction from a surface of the spacer.

27. The method according to claim 26, wherein:
the protection film is stripped from the window substrate in a first direction; and
a shape of the at least one separation extends in a second direction intersecting the first direction.

28. The method according to claim 27, further comprising:
attaching, after stripping the protection film from the window substrate, a display panel to the surface of the window substrate.

29. The method according to claim 28, wherein preparing the window comprises separating the window from a plurality of stacked windows.

30. A protection film, comprising:
a film layer; and
a spacer disposed on a surface of the film layer, the spacer comprising at least one hole,
wherein the at least one hole is a line type pattern.

* * * * *